(12) United States Patent
Kim et al.

(10) Patent No.: US 12,131,975 B2
(45) Date of Patent: Oct. 29, 2024

(54) POWER MODULE AND METHOD OF MANUFACTURING THE SAME

(71) Applicants: Hyundai Motor Company, Seoul (KR); Kia Corporation, Seoul (KR)

(72) Inventors: Hyeon Uk Kim, Hwaseong-Si (KR); Hyun Koo Lee, Seoul (KR); Sung Won Park, Incheon (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 263 days.

(21) Appl. No.: 17/728,881

(22) Filed: Apr. 25, 2022

(65) Prior Publication Data
US 2022/0415746 A1    Dec. 29, 2022

(30) Foreign Application Priority Data

Jun. 29, 2021 (KR) .................. 10-2021-0085071

(51) Int. Cl.
*H01L 23/367* (2006.01)
*H01L 21/56* (2006.01)
*H01L 23/46* (2006.01)
*H01L 23/58* (2006.01)

(52) U.S. Cl.
CPC ........ *H01L 23/3675* (2013.01); *H01L 21/565* (2013.01); *H01L 23/46* (2013.01); *H01L 23/585* (2013.01)

(58) Field of Classification Search
CPC ... H01L 23/3675; H01L 23/46; H01L 23/585; H01L 21/565
See application file for complete search history.

(56) References Cited

U.S. PATENT DOCUMENTS

| | | | | | |
|---|---|---|---|---|---|
| 5,195,023 | A | * | 3/1993 | Manzione | H05K 7/00 361/728 |
| 5,279,029 | A | * | 1/1994 | Burns | H01L 23/4334 264/102 |
| 5,559,306 | A | * | 9/1996 | Mahulikar | H01L 23/16 174/532 |
| 6,326,687 | B1 | * | 12/2001 | Corisis | H01L 23/49568 257/713 |
| 7,015,578 | B2 | * | 3/2006 | Nakamura | H01L 24/40 257/713 |
| 2001/0033477 | A1 | * | 10/2001 | Inoue | H01L 24/33 257/E23.098 |

FOREIGN PATENT DOCUMENTS

KR    10-2020-0068285    6/2020

* cited by examiner

*Primary Examiner* — Peniel M Gumedzoe
(74) *Attorney, Agent, or Firm* — Morgan, Lewis & Bockius LLP (57) ABSTRACT

A power module that includes a semiconductor chip configured to generate heat, a metal layer electrically connected to the semiconductor chip to allow current to flow therethrough, a cooling channel facing the metal layer for dissipating heat out of the semiconductor chip, and a resin layer interposed between the metal layer and the cooling channel and integrally formed in an internal space of the power module.

16 Claims, 5 Drawing Sheets

<PRESENT INVENTION>

<PRIOR ART>

FIG. 2B

<PRESENT INVENTION>

FIG. 3A

<DOUBLE-SIDED COOLING STRUCTURE>

FIG. 3B

<SINGLE-SIDED COOLING STRUCTURE>

POWER MODULE AND METHOD OF MANUFACTURING THE SAME

CROSS-REFERENCE TO THE RELATED APPLICATION

The present application claims priority to Korean Patent Application No. 10-2021-0085071, filed on Jun. 29, 2021, the entire contents of which is incorporated herein for all purposes by this reference.

BACKGROUND OF THE PRESENT DISCLOSURE

Field of the Present Disclosure

The present disclosure relates to a power module and a method of manufacturing the same, and more particularly, to a power module having a thin resin layer formed between a coolant and a metal layer bonded to a power semiconductor device provided as a heating element of the power module, minimizing a loss of cooling, and a method of manufacturing the same.

Description of Related Art

A power converter, such as an inverter, which is one of the key components of hybrid and electric vehicles, is a major component of eco-friendly vehicles and has been developed technically in various ways. Among the components of the power converter, a power module is a key component accounting for the highest cost and is being developed as a critical technology in the field of eco-friendly vehicles.

Conventionally, a power module has been manufactured in a form of a double-sided cooling power module in which cooling channels are present on both upper and lower sides of a power semiconductor device or a single-sided cooling power module in which a cooling channel is present only on one side of a power semiconductor device.

Such a conventional power module has a long heat transfer path due to a double-sided metal substrate, a spacer, or the like provided between the power semiconductor device to be cooled and the cooling channel, which may lead to deterioration in cooling performance.

Since the power module necessarily requires a thermal interface material (TIM) as a thermal conduction medium, it causes issues such as increase in material cost and addition of manufacturing processes due to the application of the TIM, as well as a decrease in cooling efficiency.

The information included in this Background of the present disclosure section is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a power module having a thin resin layer formed between a coolant and a metal layer bonded to a power semiconductor device provided as a heating element of the power module, and a method of manufacturing the same, in order to eliminate a loss of cooling, significantly improve cooling efficiency, and reduce material costs while simplifying manufacturing processes.

In accordance with an aspect of the present disclosure, the above and other objects can be accomplished by the provision of a power module that includes a semiconductor chip configured to generate heat, a metal layer electrically connected to the semiconductor chip to allow current to flow therethrough, a cooling channel facing the metal layer for dissipating heat out of the semiconductor chip, and a resin layer located between the metal layer and the cooling channel and integrally formed in an internal space of the power module.

The metal layer may include a first metal layer and a second metal layer disposed above and beneath the semiconductor chip. The cooling channel may include a first cooling channel and a second cooling channel, with the resin layer interposed between the first cooling channel and the second cooling channel, facing the first metal layer and the second metal layer, respectively.

The cooling channel may include a first cooling channel formed on a first side of the semiconductor chip and a second cooling channel formed on a second side of the semiconductor chip. The metal layer and the resin layer may be disposed between the first cooling channel and the semiconductor chip. Only the resin layer may be disposed between the second cooling channel and the semiconductor chip without the metal layer therebetween.

The second cooling channel may be formed on the other side of the semiconductor chip through the resin layer, but may not be formed on a portion that does not correspond to the other side of the semiconductor chip.

The cooling channel may include a cover structure fastened to an exposed surface of the resin layer, and a coolant may be provided between the cover structure and the resin layer.

The resin layer may have a plurality of protruding structures formed on a region of the exposed surface thereof covered by the cover structure.

In accordance with another aspect of the present disclosure, there is provided a method of manufacturing a power module, which includes bonding a metal plate to a semiconductor chip, seating on a mold a structure formed in the bonding a metal plate to a semiconductor chip, disposing a dummy block in the mold to be spaced from metal layers, forming a resin layer between the dummy block and the metal plate by filling the mold with resin for molding, and forming a cooling channel on an exposed surface of the resin layer after removing the mold and the dummy block.

In the forming a cooling channel, the cooling channel may be formed on the exposed surface corresponding to each of the metal layers.

In the bonding a metal plate to a semiconductor chip, the metal layers may be bonded above and beneath the semiconductor chip, respectively. In the forming a cooling channel, a first cooling channel and a second cooling channel may be formed on respective exposed surfaces of the molded structure corresponding to the metal layers.

In the bonding a metal plate to a semiconductor chip, one of the metal layers may be bonded to one side of the semiconductor chip and the other metal layer may be exposed on the other side of the semiconductor chip without being bonded thereto. In the disposing a dummy block, the dummy block may be disposed to be spaced from the other side of the semiconductor chip to which the associated metal layer is not bonded. In the forming a cooling channel, a first cooling channel and a second cooling channel may be formed on an exposed surface of the molded structure corresponding to an associated one of the metal layers and on an exposed surface of the molded structure corresponding to the other side of the semiconductor chip, respectively.

In the forming a cooling channel, the second cooling channel may be formed on the other side of the semiconductor chip through the resin layer, but may not be formed on a portion that does not correspond to the other side of the semiconductor chip.

In the forming a cooling channel, a cover structure may be disposed on the exposed surface of the resin layer, and a coolant may be provided between the cover structure and the resin layer.

In the forming a resin layer, the resin layer may have a plurality of protruding structures formed on a region of the exposed surface thereof covered by the cover structure.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

The specific structural and functional descriptions disclosed in the specification or application are merely illustrated for the purpose of describing embodiments of the present disclosure. The present disclosure may be embodied in different forms, and should not be construed as being limited to the embodiments set forth herein. Hereinafter, various exemplary embodiments of the present disclosure will be described in detail with reference to the accompanying drawings.

Figure 1:
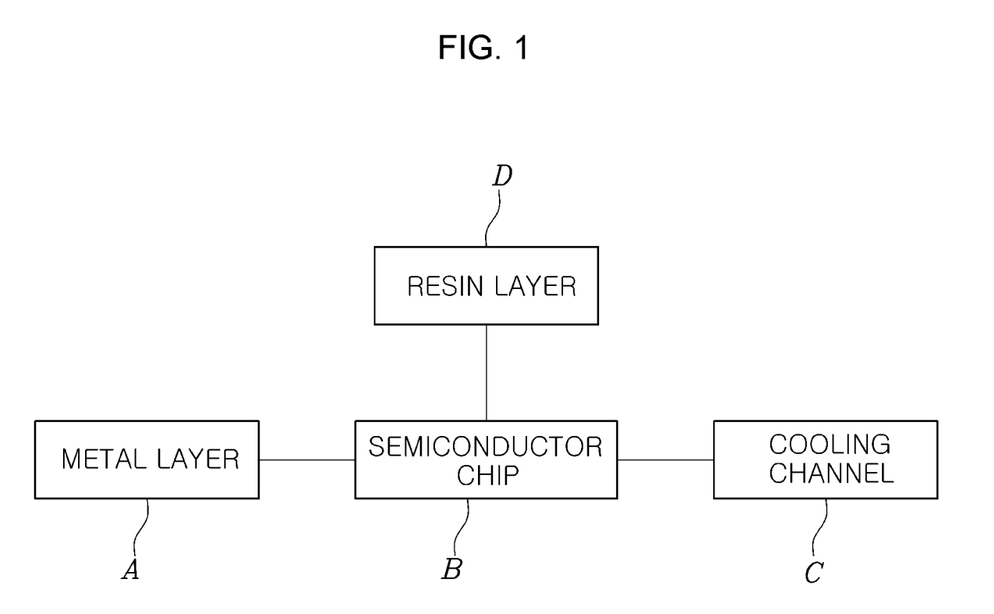
FIG. 1 is a diagram illustrating a power module according to various exemplary embodiments of the present disclosure.
Figure 2A:
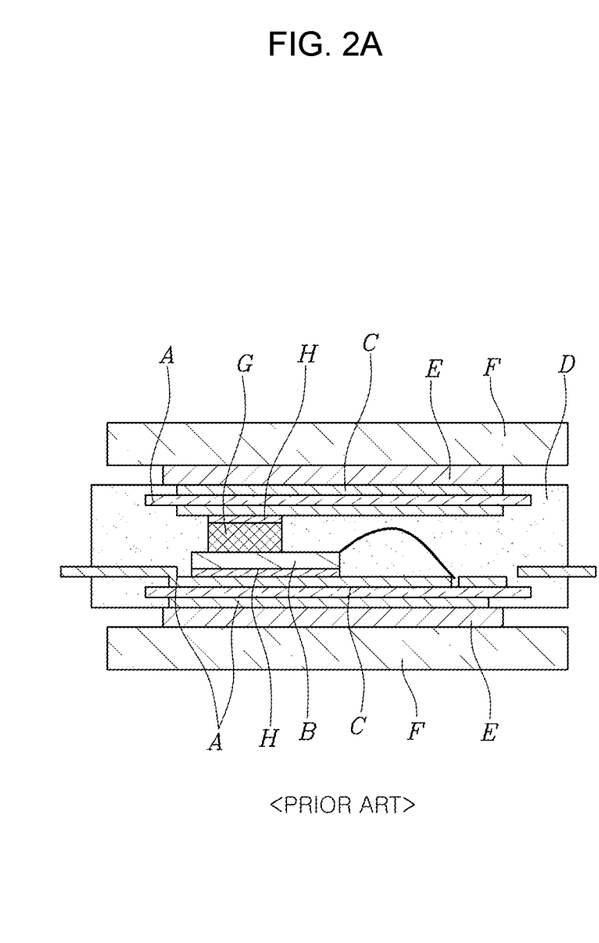
FIG. 2A and FIG. 2B are views exemplarily illustrating a structure of a conventional power module and a structure of the power module according to an exemplary embodiment of the present disclosure.
Figure 2B:
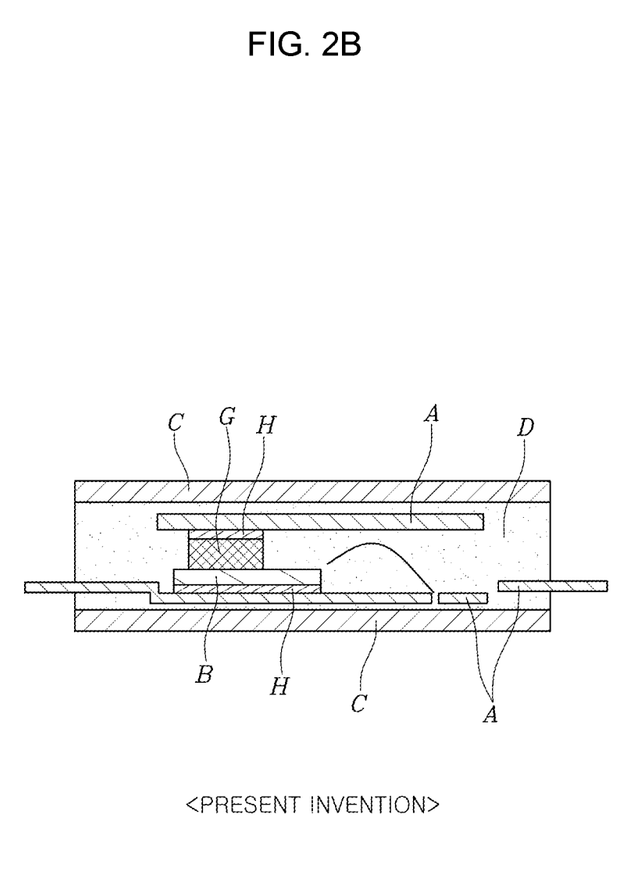
Figure 3A:
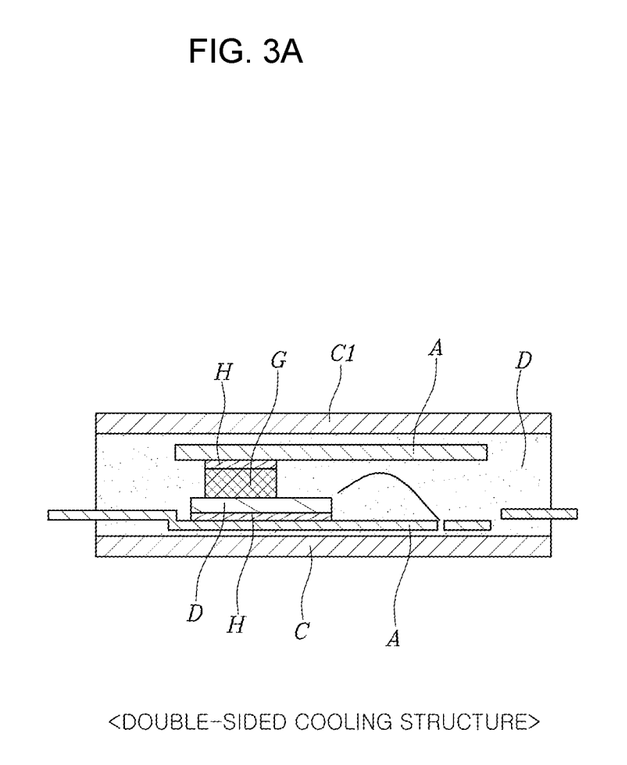
FIG. 3A and FIG. 3B are views exemplarily illustrating a power module having a double-sided cooling structure and a power module having a single-sided cooling structure according to various exemplary embodiments of the present disclosure.
Figure 3B:
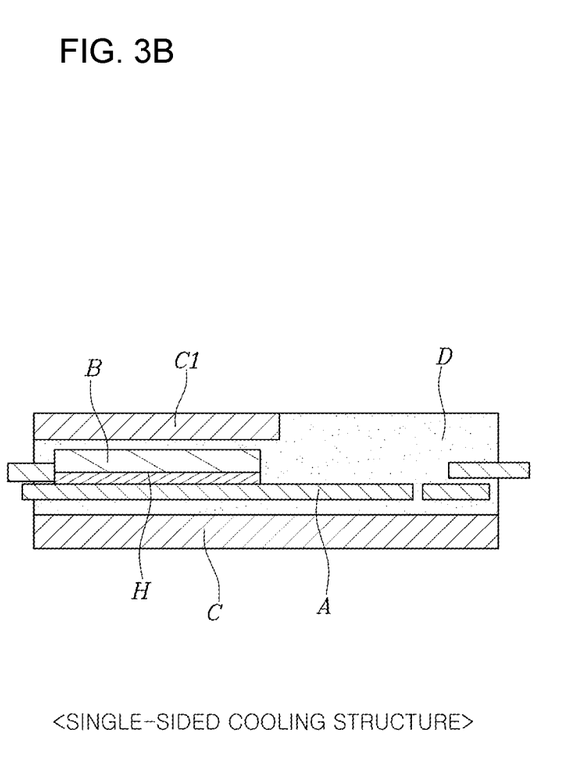
Figure 4:
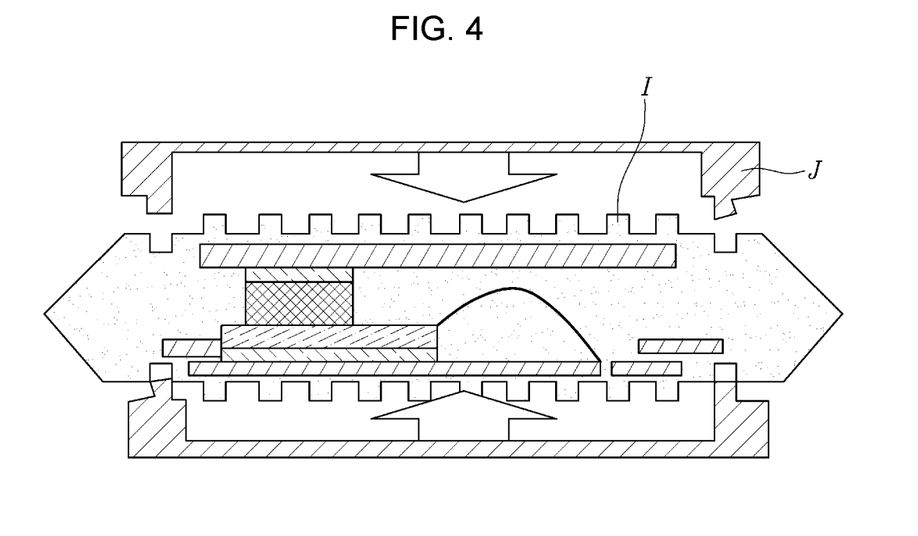
FIG. 4 is a view exemplarily illustrating a cooling channel having various shapes and a cooling channel cover therefor.
Figure 5:
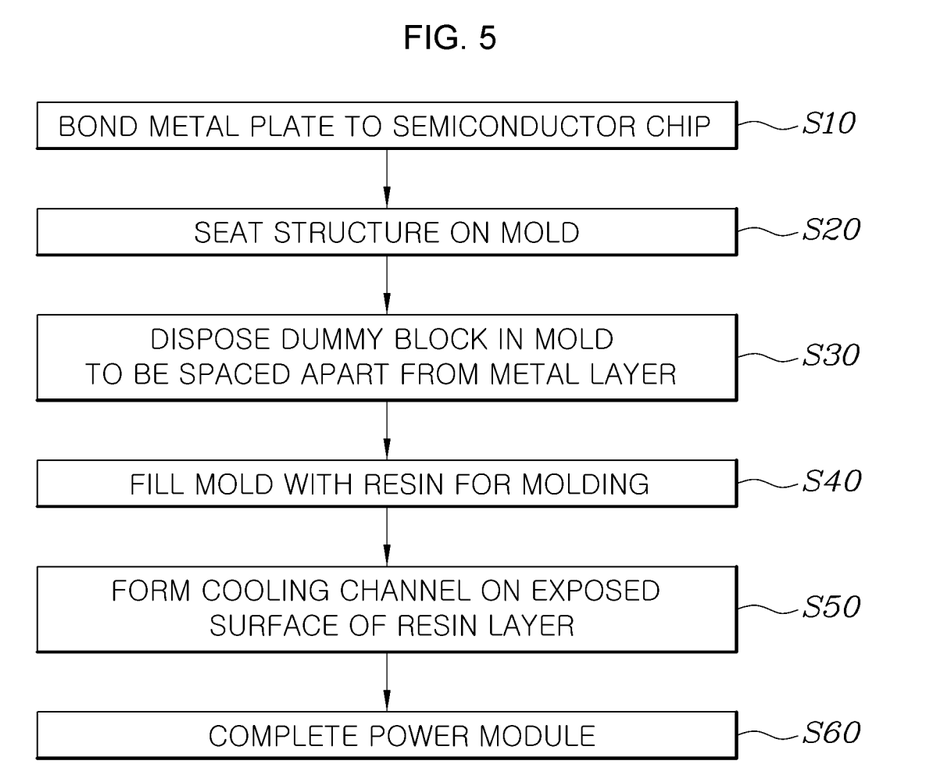
FIG. 5 is a flowchart illustrating a method of manufacturing the power module of FIG. 1.
Figure 6:
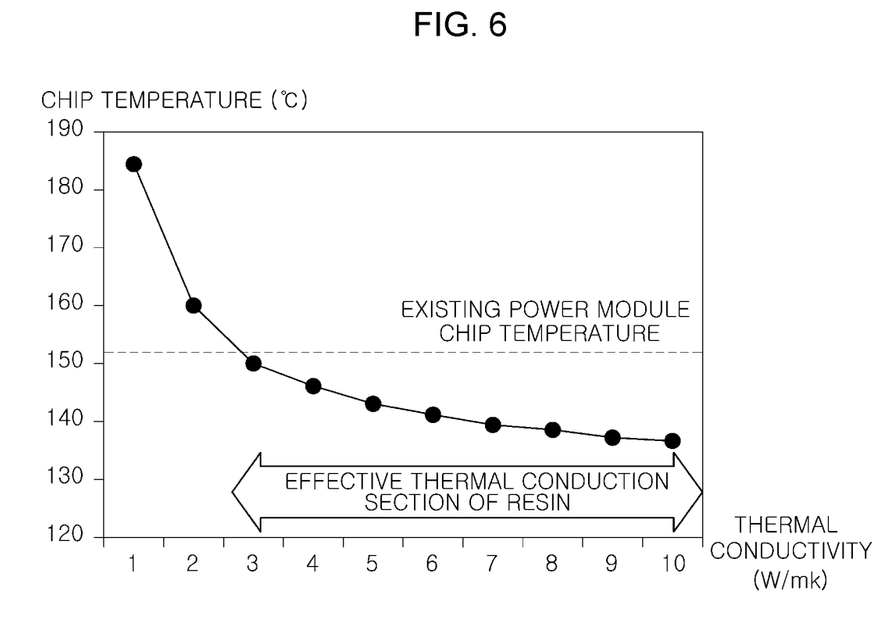
FIG. 6 is a thermal conduction graph illustrating a thermal conduction section of resin for providing cooling performance higher than that of the conventional power module when the resin layer of the present disclosure is maintained at a minimum thickness of 120 μm.
Figure 7:
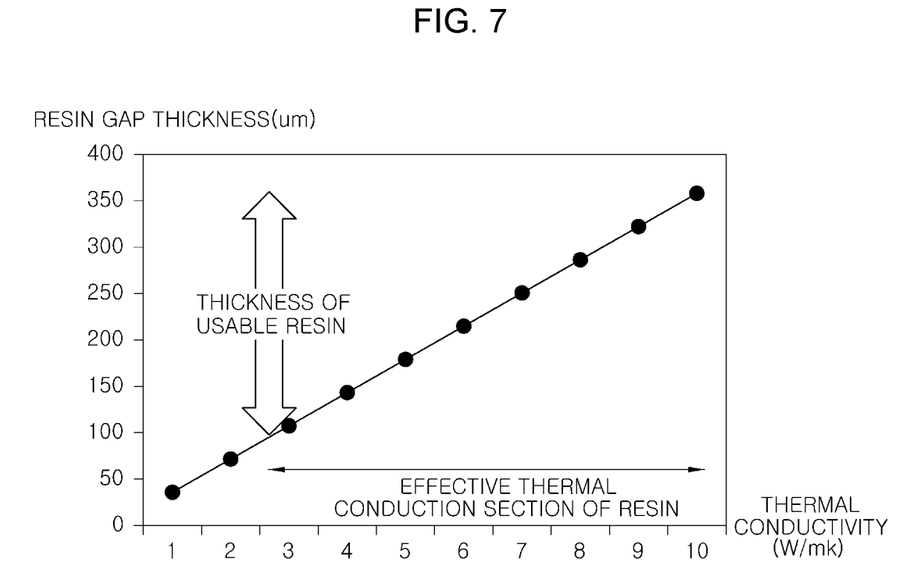
FIG. 7 is a thermal conduction graph illustrating a maximum thickness of resin in the resin layer of the present disclosure for providing cooling performance higher than that of the conventional power module.

FIG. 1 is a diagram illustrating a power module according to various exemplary embodiments of the present disclosure. FIG. 2A and FIG. 2B are views exemplarily illustrating a structure of a conventional power module and a structure of the power module according to an exemplary embodiment of the present disclosure. FIG. 3A and FIG. 3B are views exemplarily illustrating a power module having a double-sided cooling structure and a power module having a single-sided cooling structure according to various exemplary embodiments of the present disclosure. FIG. 4 is a view exemplarily illustrating a cooling channel having various shapes and a cooling channel cover therefor. FIG. 5 is a flowchart illustrating a method of manufacturing the power module of FIG. 1. FIG. 6 is a thermal conduction graph illustrating a thermal conduction section of resin for providing cooling performance higher than that of the conventional power module when the resin layer of the present disclosure is maintained at a minimum thickness of 120 μm. FIG. 7 is a thermal conduction graph illustrating a maximum thickness of resin in the resin layer of the present disclosure for providing cooling performance higher than that of the conventional power module.

FIG. 1 is a diagram illustrating the power module according to the exemplary embodiment of the present disclosure. Referring to FIG. 1, the power module includes a semiconductor chip B configured to generate heat, a metal layer A electrically connected to the semiconductor chip B to allow current to flow therethrough, a cooling channel C facing the metal layer A for dissipating heat out of the semiconductor chip B, and a resin layer D interposed between the metal layer A and the cooling channel C and integrally formed in the internal space of the power module.

The present disclosure can simplify a heat transfer path for cooling and remarkably improve cooling efficiency by disposing only a resin between a coolant and the metal layer A bonded to a power semiconductor device. Furthermore, the present disclosure does not require a separate thermal conduction medium E due to utilizing, as a portion of the cooling channel C, the resin layer D in contact with the metal layer A bonded to the power semiconductor device, eliminating a loss of cooling caused by the thermal conduction medium E and reducing material costs. To the present end, it is necessary that the resin layer D be interposed between the metal layer A and the cooling channel C and be integrally formed in the internal space of the power module.

Examples of the power module include an Insulated Gate Bipolar Transistor (IGBT) module mounted with multiple insulated gate bipolar transistors and diodes of power semiconductors used for power conversion in a dedicated case, an Intelligent Power Module (IPM) with built-in protection circuits for protection against overcurrent or overheating in an IGBT module, and a Metal Oxide Semiconductor Field Effect Transistor (MOSFET) module mounted with MOSFETs. All of these modules are used in inverter/converter circuits of on-board devices, but they are used for various types of products depending on the circuit configuration thereof and have different specifications (withstand voltage/current values, size, and the number of mounted power semiconductors). The power module generally includes the semiconductor chip B, which is connected thereto and generates heat. Therefore, the thermal conduction medium E is required to dissipate the heat generated by the semiconductor chip B.

A conventional power module has been manufactured in a form of a double-sided cooling power module in which cooling channels C are present on both upper and lower sides of a power semiconductor device or a single-sided cooling power module in which a cooling channel C is present only on one side of a power semiconductor device. However, the conventional power module requires a separate thermal interface material E as a thermal conduction medium, for dissipating heat generated by a semiconductor chip B. Hence, since the power module necessarily requires the thermal interface material (TIM) as the thermal conduction medium, it causes issues such as increase in material cost and addition of manufacturing processes due to the application of the TIM, as well as a decrease in cooling efficiency. In the instant case, the material cost of the TIM is increased and the process of applying the TIM is additionally required, which in turn causes an increase in cost to manufacture the power module. Furthermore, it is necessary to dispose a cooler F to dissipate heat from the TIM, resulting in an increase in cost to manufacture the power module due to the cooler F. Such a conventional power module has a long heat transfer path due to a double-sided metal substrate, a spacer G, or the like provided between the power semiconductor device to be cooled and the cooling channel C, which may lead to deterioration in cooling performance.

On the other hand, the present disclosure can simplify the heat transfer path for cooling and remarkably improve cooling efficiency by disposing only the resin between the coolant and the metal layer A bonded to the power semiconductor device B. Furthermore, according to the power module and the method of manufacturing the same, a separate thermal conduction medium E is not required due to utilizing, as a portion of the cooling channel C, the resin layer D in contact with the metal layer A bonded to the power semiconductor device, eliminating a loss of cooling caused by the TIM, reducing material costs, and simplifying manufacturing processes.

Specifically, the semiconductor chip B may generate heat, and may perform arithmetic operations, information memory, and control by integrating various devices such as transistors and resistance capacitors on a silicon wafer. The metal layer A is electrically connected to the semiconductor chip B to allow current to flow therethrough. The spacer G is connected to the semiconductor chip B and is installed with a constant distance from the metal layer A without coming into direct contact therewith. Accordingly, the semiconductor chip B is electrically connected to the metal layer A through a binder H.

The cooling channel C faces the metal layer A and is configured to dissipate heat out of the semiconductor chip B, and there is no need for a separate cooler due to the resin layer D. The resin layer D is interposed between the metal layer A and the cooling channel C and is integrally formed in the internal space of the power module. The resin layer D may be configured to protect the inside of the power module while simultaneously provided as a cooler. Alternatively, the resin layer D may only serve its original function without operating as a separate cooler. The resin layer D may also serve as a cooler without using a separate cooler when resin for mounting materials interposed between the metal layer A and the cooling channel C has a high thermal conductivity. Since most of existing resins for mounting materials have a low thermal conductivity (1 W/mK or less), they may not perform cooling-related functions and are used only to protect internal devices from external shock or internal thermal stress. However, by eliminating and integrating existing cooling structures as the thermal conductivity of the resin is increased, it is possible to simultaneously achieve a reduction in cost and an improvement in performance.

FIG. 6 is a thermal conduction graph illustrating a thermal conduction section of resin for providing cooling performance higher than that of the conventional power module when the resin layer D of the present disclosure is maintained at a minimum thickness of 120 μm. FIG. 7 is a thermal conduction graph illustrating a maximum thickness of resin in the resin layer D of the present disclosure for providing cooling performance higher than that of the conventional power module. The resin may be technically expected to have a maximum thermal conductivity of 1 W/mK to 10 W/mK. The higher the thermal conductivity of the resin, the higher the effectiveness of the inventive structure. Based on the minimum thickness (120 μm) of the resin, the resin have a minimum thermal conductivity of about 3 W/mK or more in order to achieve equivalent or higher performance compared to the conventional power module. In order to achieve equivalent or higher performance compared to the conventional power module, the resin layer D should have a maximum thickness of about 350 μm.

Therefore, for the resin layer D to protect internal devices from external shock or internal thermal stress while simultaneously provided as an optimized cooler, the resin layer D is integrally formed in the internal space of the power module so that the resin has a minimum thermal conductivity of about 3 W/mK or more and the resin layer D should have a maximum thickness of about 350 significantly improving the cooling efficiency of the power module.

FIG. 2A and FIG. 2B are views exemplarily illustrating a structure of the conventional power module and a structure of the power module according to an exemplary embodiment of the present disclosure.

Referring to FIG. 2A and FIG. 2B, the metal layer A may include a first metal layer A and a second metal layer A disposed above and beneath the semiconductor chip B, and the cooling channel C may include a first cooling channel C and a second cooling channel C1, with the resin layer D interposed therebetween, facing the first metal layer A and the second metal layer A, respectively.

The metal layers A are disposed above and beneath the semiconductor chip B and are electrically connected to the semiconductor chip B to allow current to flow therethrough. The cooling channels C face the metal layers A while surrounding the resin layer D. Accordingly, the first metal layer A and the second metal layer A are disposed above and beneath the semiconductor chip B. The cooling channel includes the first cooling channel C and the second cooling channel C1, with the resin layer D interposed therebetween, facing the first metal layer A and the second metal layer A, respectively. A conventional insulated power module includes both a thermal conduction medium E and a cooler F, and has a cooling channel C formed by a separate cooler and an insulating substrate (ceramic) provided therein. On the other hand, a non-insulated power module has a cooling channel C formed by a separate cooler and a metal layer A exposed on the surface thereof with no insulating layer on itself. Thus, a separate insulating layer is provided outside the non-insulated power module and is physically combined with the cooler. On the other hand, various embodiments of the present disclosure relate to a resin-integrated power module in which a cooling channel C is formed by resin without the need for a separate cooler. Therefore, the power module of the present disclosure includes an insulating layer present on the surface thereof and a metal layer A which is not exposed outside the resin.

FIG. 3A and FIG. 3B are views exemplarily illustrating a power module having a double-sided cooling structure and a power module having a single-sided cooling structure according to various exemplary embodiments of the present disclosure.

Referring to FIG. 3A and FIG. 3B, in an exemplary embodiment of the present disclosure, the cooling channel C may include the first cooling channel C formed on one side of the semiconductor chip B and the second cooling channel C1 formed on the other side of the semiconductor chip B, the metal layer A and the resin layer D may be disposed between the first cooling channel C and the semiconductor chip B, and only the resin layer D may be disposed between the second cooling channel C1 and the semiconductor chip B without the metal layer A therebetween.

As an exemplary embodiment of the present disclosure, the double-sided cooling structure is configured so that a first cooling channel C and a second cooling channel C1 formed on both sides of a semiconductor chip B have the same shape and a metal layer A and a resin layer D are disposed both between the first cooling channel C and the semiconductor chip B and between the second cooling channel C1 and the semiconductor chip B. As another example, the single-sided cooling structure is configured so that a metal layer A and a resin layer D are disposed between a first cooling channel C and a semiconductor chip B and only the resin layer D is disposed between a second cooling channel C1 and the semiconductor chip B without the metal layer A therebetween. The power module having the single-sided cooling structure does not require a spacer G and a binder H connecting the metal layer A and the chip B since only the resin layer D is disposed between the second cooling channel C1 and the semiconductor chip B without the metal layer A therebetween, achieving a reduction in material cost.

Here, the second cooling channel C1 may be formed on the other side of the semiconductor chip B through the resin layer D, but may not be formed on a portion that does not correspond to the other side of the semiconductor chip B.

As described above, the single-sided cooling structure is configured so that the metal layer A and the resin layer D are disposed between the first cooling channel C and the semiconductor chip B and only the resin layer D is disposed between the second cooling channel C1 and the semiconductor chip B without the metal layer A therebetween. Therefore, the second cooling channel C1 is formed on the other side of the semiconductor chip B through the resin layer D, but is not formed on a portion that does not correspond to the other side of the semiconductor chip B.

FIG. 4 is a view exemplarily illustrating a cooling channel C having various shapes and a cooling channel cover therefor.

Referring to FIG. 4, the cooling channel C includes a cover structure J fastened to the exposed surface of the resin layer D, and a coolant may be provided between the cover structure J and the resin layer D.

The cover structure J is fastened to the exposed surface of the resin layer D to form the cooling channel C, and the cover structure J may be made of a material such as metal or plastic. In a process of manufacturing the power module, a cover for the cooling channel C may be separately produced by filling a mold with resin for molding and then releasing a molded product from the mold to fasten a cover structure J to the molded product.

The resin layer D may have a plurality of protruding structures I formed on one region of the exposed surface thereof covered by the cover structure J.

The power module may have various shapes by making the cooling channel C have different shapes. Furthermore, the plurality of protruding structures I may be formed on one region of the exposed surface covered by the cover structure J, resulting in an increase in the surface area of the cooling channel C. Due to the shape of the cooling channel C with an increased surface area, heat generated by the semiconductor chip B can be dissipated more smoothly.

FIG. 5 is a flowchart illustrating a method of manufacturing the power module of FIG. 1.

Referring to FIG. 5, there is provided a method of manufacturing a power module, which includes a step of bonding a metal plate to a semiconductor chip B (S10), a step of seating on a mold a structure J formed in the bonding step (S20), a step of disposing a dummy block in the mold to be spaced from metal layers A (S30), a step of forming a resin layer D between the dummy block and the metal plate by filling the mold with resin for molding (S40), and a step of forming a cooling channel C on the exposed surface of the resin layer D after removing the mold and the dummy block (S50).

In the step of forming the cooling channel C, the cooling channel C may be formed on the exposed surface corresponding to each of the metal layers A.

In the step of bonding the metal plate to the semiconductor chip B, the metal layers A may be bonded above and beneath the semiconductor chip B, respectively. In the step of forming the cooling channel C, a first cooling channel C and a second cooling channel C1 may be formed on the respective exposed surfaces of the molded structure J corresponding to the metal layers A.

In the step of bonding the metal plate to the semiconductor chip B, one of the metal layers A may be bonded to one side of the semiconductor chip B and the other metal layer A may be exposed on the other side of the semiconductor chip B without being bonded thereto. In the step of disposing the dummy block, the dummy block may be disposed to be spaced from the other side of the semiconductor chip B to which the associated metal layer A is not bonded. In the step of forming the cooling channel C, the first cooling channel C and the second cooling channel C1 may be formed on the exposed surface of the molded structure J corresponding to an associated one of the metal layers A and on the exposed surface of the molded structure J corresponding to the other side of the semiconductor chip B, respectively.

In the step of forming the cooling channel C, the second cooling channel C1 may be formed on the other side of the semiconductor chip B through the resin layer D, but may not be formed on a portion that does not correspond to the other side of the semiconductor chip B.

In the step of forming the cooling channel C, a cover structure J may be disposed on the exposed surface of the resin layer D, and a coolant may be provided between the cover structure J and the resin layer D.

In the step of forming the resin layer D, the resin layer D may have a plurality of protruding structures I formed on one region of the exposed surface thereof covered by the cover structure J.

As is apparent from the above description, according to the power module and the method of manufacturing the same, it is possible to simplify the heat transfer path for cooling and remarkably improve cooling efficiency by disposing only the resin between the coolant and the metal layer bonded to the power semiconductor device.

Furthermore, according to the power module and the method of manufacturing the same, since a separate thermal interface material TIM is not required due to utilizing, as a portion of the cooling channel, the resin layer in contact with the metal layer bonded to the power semiconductor device, it is possible to eliminate a loss of cooling caused by the TIM, reduce material costs, and simplify manufacturing processes.

The present disclosure is not limited to the above-mentioned effects, and other effects of the present disclosure can be clearly understood by those skilled in the art to which an exemplary embodiment of the present disclosure pertains from the above description.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the present disclosure and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A power module comprising:
a semiconductor chip;
a metal layer electrically connected to the semiconductor chip to allow current to flow therethrough;
a cooling channel facing the metal layer for dissipating heat out of the semiconductor chip; and
a resin layer interposed between the metal layer and the cooling channel and integrally formed in an internal space of the power module,
wherein the cooling channel includes a cover structure fastened to an exposed surface of the resin layer, and a coolant is provided between the cover structure and the resin layer.

2. The power module of claim 1,
wherein the metal layer includes a first metal layer and a second metal layer disposed above and beneath the semiconductor chip, respectively, and
wherein the cooling channel includes a first cooling channel and a second cooling channel, with the resin layer interposed between the first cooling channel and the second cooling channel, and the first cooling channel faces the first metal layer and the second cooling channel faces the second metal layer.

3. The power module of claim 1,
wherein the cooling channel includes a first cooling channel formed on a first side of the semiconductor chip and a second cooling channel formed on a second side of the semiconductor chip,
wherein the metal layer and the resin layer are disposed between the first cooling channel and the semiconductor chip, and
wherein only the resin layer is disposed between the second cooling channel and the semiconductor chip without the metal layer therebetween.

4. The power module of claim 1, wherein the resin layer has a plurality of protruding structures formed on a region of the exposed surface thereof covered by the cover structure.

5. The power module of claim 1, wherein the semiconductor chip is electrically connected to the metal layer through a binder.

6. The power module of claim 1, wherein the resin layer has a maximum thickness of about 350 μm.

7. A power module comprising:
a semiconductor chip;
a metal layer electrically connected to the semiconductor chip to allow current to flow therethrough;
a cooling channel facing the metal layer for dissipating heat out of the semiconductor chip; and
a resin layer interposed between the metal layer and the cooling channel and integrally formed in an internal space of the power module,
wherein the cooling channel includes a first cooling channel formed on a first side of the semiconductor chip and a second cooling channel formed on a second side of the semiconductor chip,
wherein the metal layer and the resin layer are disposed between the first cooling channel and the semiconductor chip,
wherein only the resin layer is disposed between the second cooling channel and the semiconductor chip without the metal layer therebetween, and
wherein the second cooling channel is formed on the second side of the semiconductor chip through the resin layer, but is not formed on a portion that does not correspond to the second side of the semiconductor chip.

8. A method of manufacturing a power module, the method comprising:
bonding a metal plate to a semiconductor chip;
seating on a mold a structure formed in the bonding a metal plate to a semiconductor chip;
disposing a dummy block in the mold to be spaced from metal layers;
forming a resin layer between the dummy block and the metal plate by filling the mold with resin for molding; and
forming a cooling channel on an exposed surface of the resin layer after removing the mold and the dummy block.

9. The method of claim 8, wherein in the forming a cooling channel, the cooling channel is formed on the exposed surface corresponding to each of the metal layers.

10. The method of claim 8,
wherein in the bonding a metal plate to a semiconductor chip, the metal layers are bonded above and beneath the semiconductor chip, respectively, and wherein in the forming a cooling channel, a first cooling channel and a second cooling channel are formed on respective exposed surfaces of the molded structure corresponding to the metal layers.

11. The method of claim 8,
wherein in the bonding a metal plate to a semiconductor chip, one of the metal layers is bonded to a first side of the semiconductor chip and the other metal layer is exposed on a second side of the semiconductor chip without being bonded thereto,
wherein in the disposing a dummy block, the dummy block is disposed to be spaced from the second side of the semiconductor chip to which the associated metal layer is not bonded, and
wherein in the forming a cooling channel, a first cooling channel and a second cooling channel are formed on an exposed surface of the molded structure corresponding to an associated one of the metal layers and on an exposed surface of the molded structure corresponding to the second side of the semiconductor chip, respectively.

12. The method of claim 11, wherein in the forming a cooling channel, the second cooling channel is formed on the second side of the semiconductor chip through the resin layer, but is not formed on a portion that does not correspond to the second side of the semiconductor chip.

13. The method of claim 12, wherein the resin layer has a maximum thickness of about 350 μm.

14. The method of claim 11, wherein the semiconductor chip is electrically connected to the one metal layer through a binder.

15. The method of claim 8, wherein in the forming a cooling channel, a cover structure is disposed on the exposed surface of the resin layer, and a coolant is provided between the cover structure and the resin layer.

16. The method of claim 15, wherein in the forming a resin layer, the resin layer has a plurality of protruding structures formed on a region of the exposed surface thereof covered by the cover structure.

* * * * *